United States Patent
Diao et al.

(10) Patent No.: US 6,984,785 B1
(45) Date of Patent: Jan. 10, 2006

(54) THERMALLY ENHANCED CAVITY-DOWN INTEGRATED CIRCUIT PACKAGE

(75) Inventors: Qizhong Diao, Fremont, CA (US); Neil McLellan, Danville, CA (US); Mohan Kirloskar, Cupertino, CA (US)

(73) Assignee: ASAT Ltd., New Territories (HK)

( * ) Notice: Subject to any disclaimer, the term of this patent is extended or adjusted under 35 U.S.C. 154(b) by 0 days.

(21) Appl. No.: 10/694,511

(22) Filed: Oct. 27, 2003

(51) Int. Cl.
    *H01L 23/28* (2006.01)
(52) U.S. Cl. .................. 174/52.2; 174/52.4; 257/707; 257/713
(58) Field of Classification Search ............... 174/52.4, 174/52.2; 257/713, 712, 707
    See application file for complete search history.

(56) References Cited

U.S. PATENT DOCUMENTS

| | | | |
|---|---|---|---|
| 5,357,672 A | 10/1994 | Newman ..................... 29/830 |
| 5,578,869 A * | 11/1996 | Hoffman et al. ............ 257/691 |
| 5,659,458 A * | 8/1997 | Patchen ...................... 361/704 |
| 5,805,427 A * | 9/1998 | Hoffman ..................... 361/770 |
| 5,910,686 A | 6/1999 | Hamzehdoost et al. ..... 257/778 |
| 5,999,415 A | 12/1999 | Hamzehdoost .............. 361/803 |
| 6,175,497 B1 | 1/2001 | Tseng et al. ................ 361/704 |
| 6,184,580 B1 * | 2/2001 | Lin ............................. 257/712 |
| 6,266,251 B1 | 7/2001 | Bassi et al. ................. 361/761 |
| 6,414,849 B1 | 7/2002 | Chiu .......................... 361/760 |
| 6,475,327 B2 | 11/2002 | Tung et al. ............... 156/306.6 |
| 6,590,281 B2 * | 7/2003 | Wu et al. .................... 257/684 |
| 6,713,321 B2 * | 3/2004 | Huang et al. ............... 438/122 |
| 2002/0096767 A1 * | 7/2002 | Cote et al. .................. 257/738 |
| 2002/0109226 A1 * | 8/2002 | Khan et al. ................. 257/737 |
| 2003/0129863 A1 * | 7/2003 | Alcoe et al. .................. 439/73 |

\* cited by examiner

*Primary Examiner*—Hung V. Ngo
(74) *Attorney, Agent, or Firm*—Keating & Bennett, LLP

(57) ABSTRACT

A cavity-down ball grid includes a flexible circuit tape including a flexible tape laminated to a conductor layer. The flexible circuit tape has an aperture therein. A thermally conductive heat spreader is fixed to a first surface of the flexible circuit tape and the heat spreader has a cavity aligned with the aperture of the flexible circuit tape. A semiconductor die is mounted to the heat spreader in a die-down configuration in the cavity. A thermally conductive die adapter is fixed to the semiconductor die such that a portion of the die adapter protrudes from the cavity. A plurality of wire bonds connect the semiconductor die to bond sites on the second surface of the flexible circuit tape. An encapsulating material encapsulates the semiconductor die and the wire bonds and a plurality of solder balls are disposed on a second surface of the flexible circuit tape, in the form of a ball grid array.

9 Claims, 5 Drawing Sheets

THERMALLY ENHANCED CAVITY-DOWN INTEGRATED CIRCUIT PACKAGE

FIELD OF THE INVENTION

The present invention relates in general to integrated circuit packaging, and more particularly to a ball grid array integrated circuit package with improved thermal characteristics.

BACKGROUND OF THE INVENTION

High performance integrated circuit (IC) packages are well known in the art. Improvements in IC packages are driven by industry demands for increased thermal and electrical performance and decreased size and cost of manufacture.

In general, array packaging such as Tape Ball Grid Array (TBGA) packages provide a high density of interconnects relative to the surface area of the package. Typical TBGA packages include a flexible circuit tape substrate and a semiconductor die attached to the substrate by a die adhesive. Gold wire bonds electrically connect the die to circuitry of the substrate and the wire bonds and die are encapsulated in a molding material. Solder balls are disposed on the bottom surface of the substrate for signal transfer.

Typically, array packaging, such as ball grid array (BGA) packages provide for a high density package including a convoluted signal path, giving rise to high impedance and an inefficient thermal path which results in poor thermal dissipation performance. With increasing package density, the spreading of heat generated by the device is increasingly important.

FIG. 1 shows a sectional side view of a cavity-down BGA package indicated generally by the numeral 20. The cavity-down BGA package 20 includes a flexible circuit tape 22 of laminated layers including a signal, trace and pad layer, referred to as a conductor layer, laminated on a polyimide tape. An aperture extends through the flexible circuit tape 22 and the flexible circuit tape 22 is laminated to a heat spreader 24 which includes a cavity that is aligned with the cavity of the flexible circuit tape 22. A semiconductor die 26 is mounted in a die-down configuration in the cavity of the heat spreader 24 and wire bonds 28 extend between the semiconductor die and wire-bonding sites of the flexible circuit tape 22. The semiconductor die 26 and the wire bonds 28 are encapsulated in an encapsulating material 30 which fills the cavities of the heat spreader 24 and the flexible circuit tape 22 and protrudes to cover the wire bonds 28. A number of solder balls 32 are attached to solder ball pads of the flexible circuit tape 22, in the form of a ball grid array. The heat spreader 24 provides improved heat dissipation in comparison with prior ball grid array packages.

Further improvements in thermal and electrical performance are still desirable in order to meet industry demands.

SUMMARY OF THE INVENTION

In one aspect of the present invention, there is provided a cavity-down ball grid array package having a flexible circuit tape including a flexible tape laminated to a conductor layer. The flexible circuit tape has an aperture therein. A thermally conductive heat spreader is fixed to a first surface of the flexible circuit tape and the heat spreader has a cavity aligned with the aperture of the flexible circuit tape. A semiconductor die is mounted to the heat spreader in a die-down configuration in the cavity. A thermally conductive die adapter is fixed to the semiconductor die such that a portion of the die adapter protrudes from the cavity. A plurality of wire bonds connect the semiconductor die to bond sites on the second surface of the flexible circuit tape. An encapsulating material encapsulates the semiconductor die and the wire bonds and a plurality of solder balls are disposed on a second surface of the flexible circuit tape, in the form of a ball grid array.

In another aspect of the present invention, there is provided a method of fabricating a cavity-down ball grid array package. The method includes providing a flexible circuit tape including a flexible tape laminated to a conductor layer, the flexible circuit tape having an aperture therein, fixing a thermally conductive heat spreader to a first surface of the flexible circuit tape, the heat spreader having a cavity aligned with the aperture of the flexible circuit tape. The method further includes mounting a semiconductor die to the heat spreader in a die-down configuration in the cavity, and attaching a thermally conductive die adapter to the semiconductor die such that a portion of the die adapter protrudes from the cavity and wire bonding the semiconductor die to bond sites on the second surface of the flexible circuit tape. The semiconductor die and the wire bonds are encapsulated in an encapsulating material and a plurality of solder balls are fixed on a second surface of the flexible circuit tape, in the form of a ball grid array.

Advantageously a direct thermal path from the semiconductor die to the printed circuit board, is provided. In one aspect, a plurality of thermally conductive portions are employed that together form an adapter. In a particular aspect, non-electrically conductive adapter portions are employed. In another particular embodiment, electrically conductive adapter portions are employed and wire bonds connect the semiconductor die to portions of the die adapter, which perform as a solid power or ground.

BRIEF DESCRIPTION OF THE DRAWINGS

The present invention will be better understood with reference to the following drawings in which like numerals denote like parts and wherein.

DETAILED DESCRIPTION OF THE PREFERRED EMBODIMENTS

Figure 1:
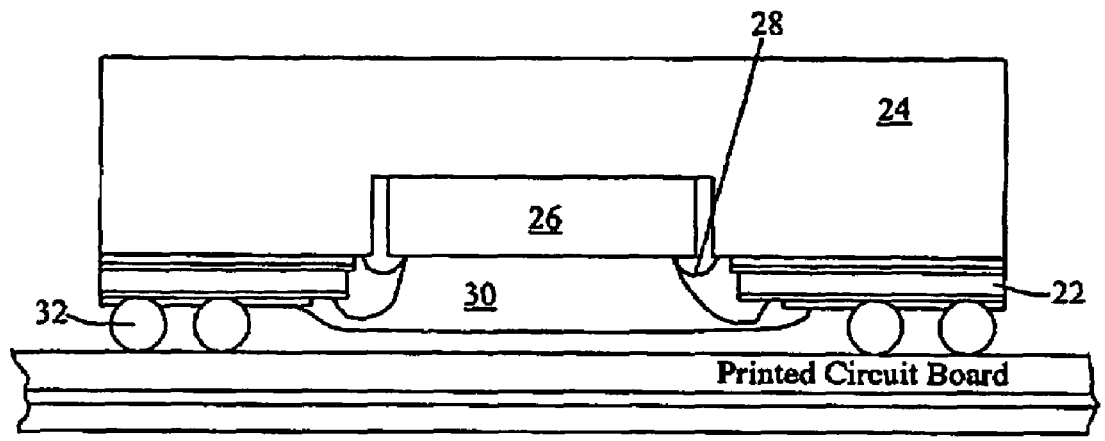
FIG. 1 is a sectional side view of a conventional ball grid array package including a heat spreader.
Figure 2:
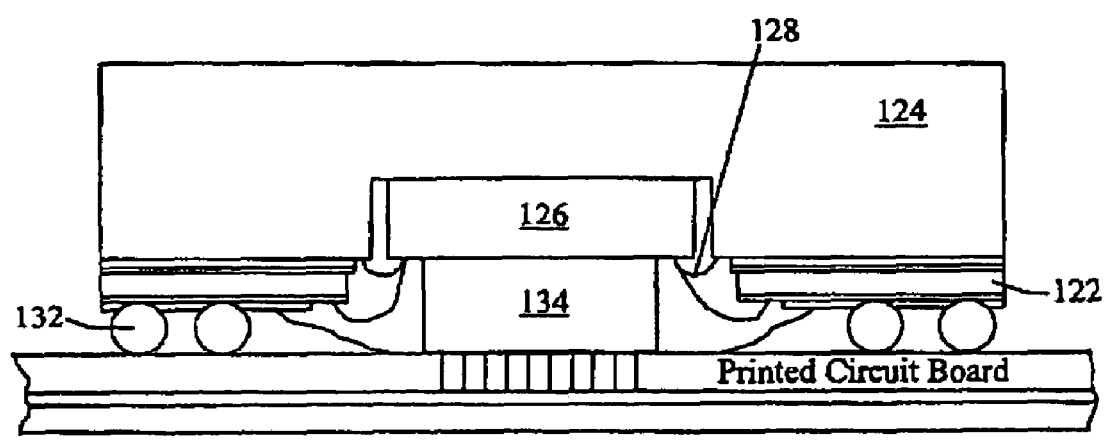
FIG. 2 is a sectional side view of a cavity-down ball grid array package according to an embodiment of the present invention.

Referring to FIG. 2, there is provided a cavity-down ball grid array package 120 in accordance with an embodiment of the present invention. To simplify the description, the numerals used previously in describing FIG. 1 will be used again after raising the numerals by 100, where the parts to be described correspond to parts already described hereinabove.

The package 120 includes a flexible circuit tape 122 including a flexible tape laminated to a conductor layer. The flexible circuit tape 122 has an aperture therein. A thermally conductive heat spreader 124 is fixed to a first surface of the flexible circuit tape 122 and the heat spreader 124 has a cavity aligned with the aperture of the flexible circuit tape 122. A semiconductor die 126 is mounted to the heat spreader 124 in a die-down configuration in the cavity. A thermally conductive die adapter 134 is fixed to the semiconductor die 126 such that a portion of the die adapter 134 protrudes from the cavity. A plurality of wire bonds 128 connect the semiconductor die 126 to bond sites on the second surface of the flexible circuit tape 122. An encapsulating material 130 encapsulates the semiconductor die 126 and the wire bonds 128 and a plurality of solder balls 132 are disposed on a second surface of the flexible circuit tape 122, in the form of a ball grid array.

A method for fabricating the package 120 will now be described in more detail, with reference to FIGS. 3A to 3G, which show processing steps for fabricating the cavity-down ball grid array package 120. For ease of illustration, reference to a single cavity-down ball grid array package is made throughout the description hereinbelow. It will be understood that the cavity-down package 120 is preferably gang fabricated and then singulated by sawing or punching, however.

Figure 3A:
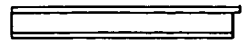
FIGS. 3A to 3G show processing steps for fabricating the cavity-down ball grid array package of FIG. 2.

Referring to FIG. 3A, the flexible circuit tape 122 is shown. The flexible circuit tape 122 includes a plurality of layers, including a signal trace and pad layer, also referred to herein as a conductor layer, laminated to a polyimide tape. The flexible circuit tape 122 also includes a number of wire bonding sites and a number of solder ball pads. A solder mask covers the flexible circuit tape 122, with the exception of the wire bonding sites and the solder ball pads. The solder mask is an electrical insulator for electrically isolating the conductor layer and adhesive used in fixing the heat spreader 124 to the flexible circuit tape 122.

Figure 3B:
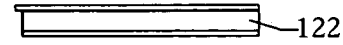
Figure 3B:
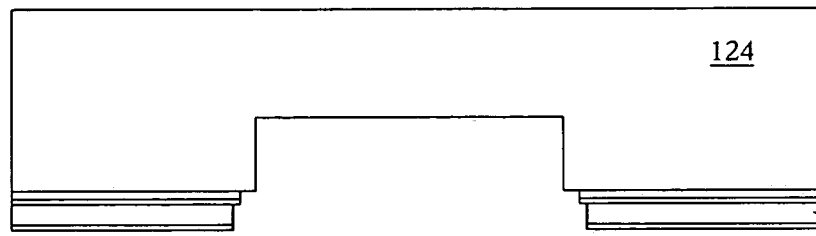

The heat spreader 124, formed of thermally conductive material such as a metallic or suitable ceramic material, including a die-cavity therein, is fixed to the flexible circuit tape 122 using a tape adhesive such that the die-cavity is aligned with the aperture in the flexible circuit tape 122 (FIG. 3B). It will be appreciated that the heat spreader 124 is preferably in the form of a leadframe strip for the purpose of gang fabrication as indicated above.

Figure 3C:
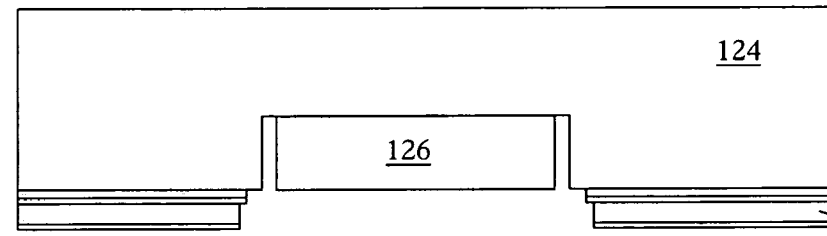

Next, the semiconductor die 126 is mounted in the cavity of the heat spreader 124, in a die-down configuration, using conventional die attach technique, such as epoxy attach and curing (FIG. 3C).

Figure 3D:
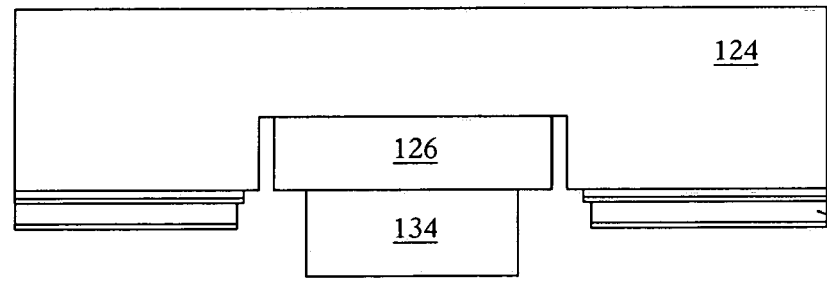

The thermally conductive die adapter 134 is then mounted on the semiconductor die 126 such that a portion of the die adapter 134 protrudes from the cavity (FIG. 3D). Suitable die adapter materials include, for example, silicon, which has similar thermo-mechanical properties to the semiconductor die and silicon coated with a vapor deposited layer of a solderable surface such as Cr, Ni and Au. Other die adapter materials are also possible, including copper, alumina, and low expansion alloys such as NiFe and A42 alloys.

Figure 3E:
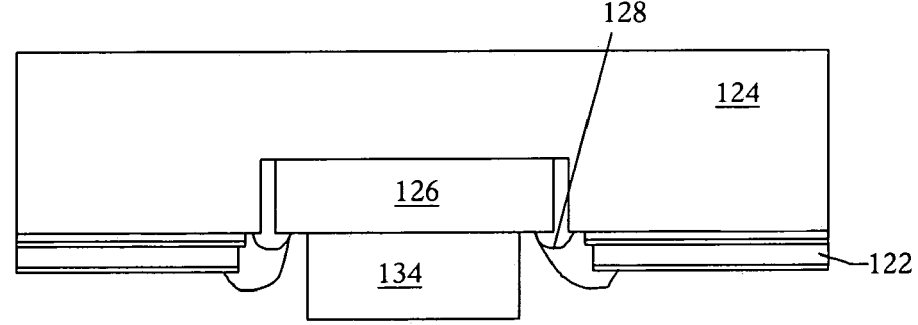

Wire bonds 128 are then bonded between pads of the semiconductor die 126 and the wire bonding sites of the flexible circuit tape (FIG. 3E). Thus, the wire bonds 128 extend between the pads of the semiconductor die 126 in the cavity, and the flexible circuit tape 122 that is outside of the cavity. As shown in FIG. 3E, wire bonds are also bonded between pads of the semiconductor die 126 and the heat spreader 124.

Figure 3F:
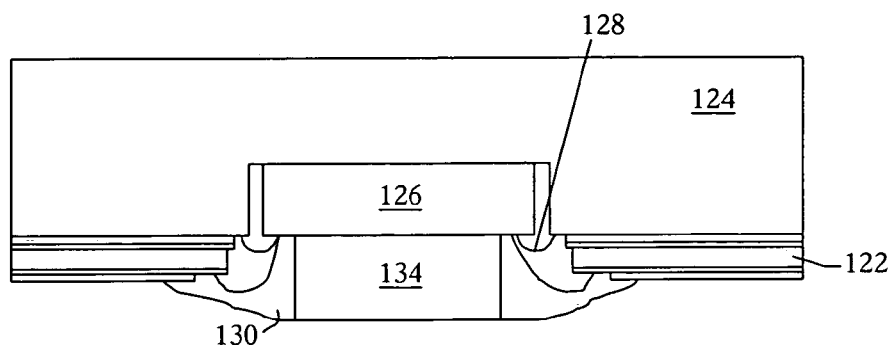

Next, the semiconductor die 126 and wire bonds 128 are encapsulated in a glob-top encapsulating material 130 such that the outer surface of the die adapter 134 (the adapter surface that is opposite the surface that is attached to the semiconductor die 126), is exposed (FIG. 3F). The glob-top encapsulating material 130 fills the cavity and is sufficient to cover the wire bonds 128, thereby protecting the semiconductor die 126 and the wire bonds 128, without covering the outer surface of the die adapter 134.

Figure 3G:
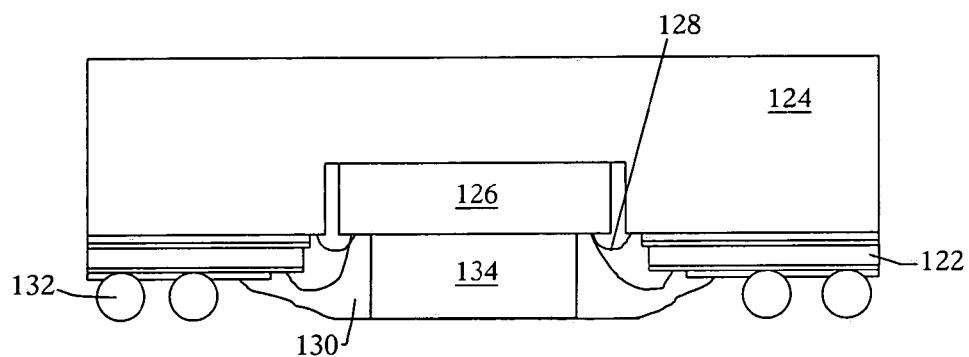

A plurality of solder balls 132 are attached to the solder ball pads of the flexible circuit tape 122 to form a ball grid array (FIG. 3G). To attach the solder balls 132, a flux is first added to the solder ball pads on the flexible circuit tape 122 and, after placement of the solder balls 132 on the solder ball pads, the solder balls 132 are reflowed using known reflow techniques. The solder balls 132 on the ball pads provide signal and power connections from the solder balls 132, through the flexible circuit tape 122, through the wire bonds 128 to the semiconductor die 126. Next, excess flux is removed by cleaning with a suitable cleaner.

As stated hereinabove the cavity-down package 120 is preferably gang fabricated. Thus, the package is singulated using a saw or punch technique. The singulated package is ready for attachment to a printed circuit board, as shown in FIG. 2. The die adapter 134 is exposed for attaching to a printed circuit board when the package 120 is mounted on a printed circuit board. When attached to the printed circuit board, the die adapter 134 provides a thermal path from the semiconductor die 126 to the printed circuit board. In this configuration, thermal vias in the printed circuit board are utilized in dispersing heat from the package 120. Suitable materials for attaching the die adapter 134 to the printed circuit board include thermally conductive materials such as solder and epoxy. Thus, the die adapter 134 is suitably sized and shaped to provide a thermal path between the semiconductor die 126 and the printed circuit board when the singulated package 120 is attached to the printed circuit board.

Figure 4A:
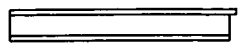
FIGS. 4A to 4G show processing steps for fabricating a cavity-down ball grid array package according to another embodiment of the present invention.
Figure 4B:
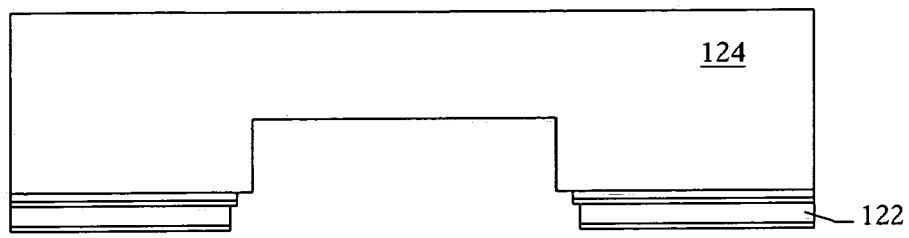
Figure 4C:
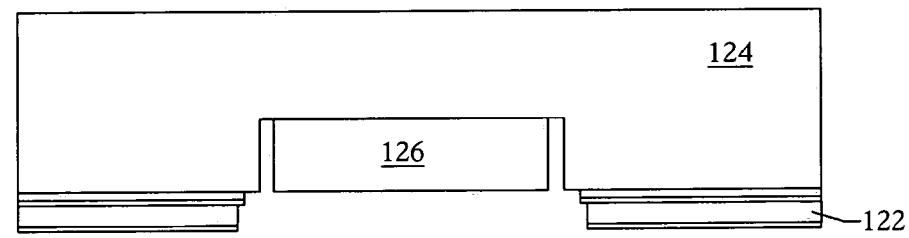
Figure 4D:
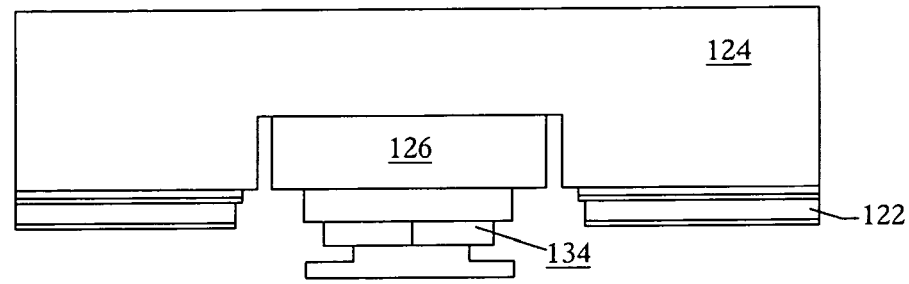

Reference is now made to FIGS. 4A to 4G to describe the processing steps according to an alternative embodiment of the present invention. FIGS. 4A to 4C are similar to FIGS. 3A to 3C and therefore need not be further described herein. In the present embodiment as shown in FIG. 4D, a plurality of thermally conductive die adapter portions are stacked together by attaching the portions together with an electrically non-conductive adhesive, to form the die adapter 134. In the present embodiment, the die adapter 134 includes four die adapter portions that are stacked together and are electrically isolated from each other.

Figure 4E:
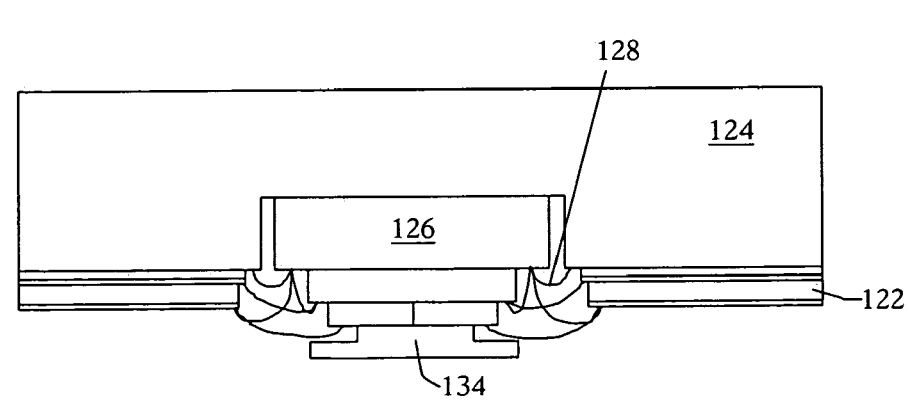

As shown in FIG. 4E, wire bonds 128 are bonded between pads of the semiconductor die 126 and the wire bonding sites of the flexible circuit tape and between pads of the semiconductor die and the heat spreader 124. In the present embodiment, wire bonds 128 are also bonded between pads of the semiconductor die 126 and portions of the die adapter 134, between the flexible circuit tape 122 and portions of the die adapter 134 and between portions of the die adapter 134 and the heat spreader 124.

Figure 4F:
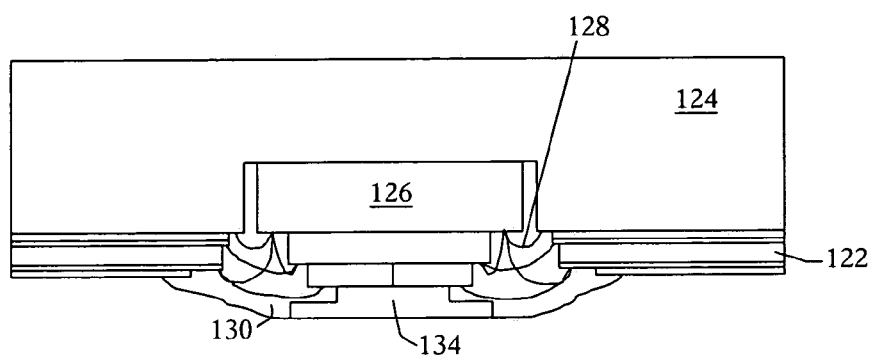

Glob top encapsulation material 130 is added in FIG. 4F such that the portions of the die adapter 134 are surrounded by the glob top material 130, except the die adapter portion distal the semiconductor die 126. The distal surface of this portion is exposed.

Figure 4G:
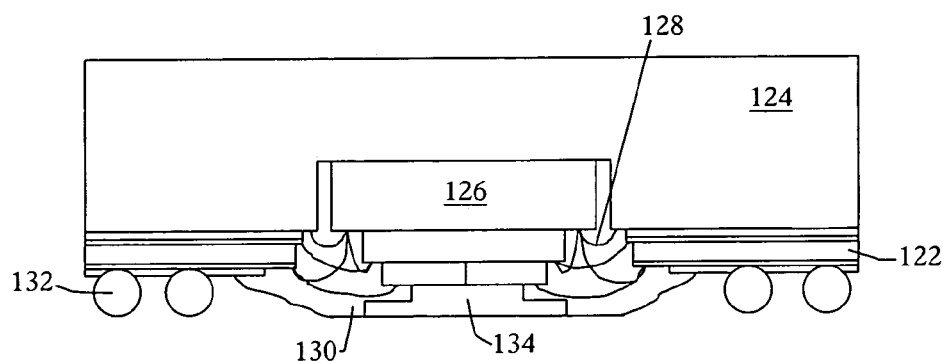

FIG. 4G is similar to FIG. 3G and therefore need not be further described herein.

Other embodiments and variations may occur to those of skill in the art. For example, the size and shape of many of the elements can differ while still performing the same functions. The particular wiring configuration may differ. Any suitable number of portions of the die adapter can be employed. Portions of the die adapter can be electrically conductive or can be electrically non-conductive and the die adapter portions can be electrically isolated from each other or can be electrically connected. Portions of the die adapter of the embodiment of FIGS. 4A to 4G can perform as a solid power or a solid ground. Those skilled in the art may conceive of still other embodiments and variations, all of which are believed to be within the scope and sphere of the present invention.

What is claimed is:

1. A cavity-down ball grid array package comprising:
   a flexible circuit tape including a flexible tape laminated to a conductor layer, the flexible circuit tape having an aperture therein;
   a thermally conductive heat spreader directly fixed to a first surface of the flexible circuit tape, the heat spreader having a cavity aligned with the aperture of the flexible circuit tape;
   a semiconductor die mounted to the heat spreader, in a die-down configuration in said cavity;
   a thermally conductive die adapter fixed to said semiconductor die such that a portion of said die adapter protrudes from said cavity;
   a plurality of wire bonds connecting said semiconductor die to bond sites on said second-surface of said flexible circuit tape;
   an encapsulating material encapsulating said semiconductor die and said wire bonds; and
   a plurality of solder balls disposed on a second surface of the flexible circuit tape, in the form of a ball grid array,
   wherein said die adapter comprises a plurality of thermally conductive die adapter portions fixed side-by-side on said semiconductor die.

2. The cavity-down ball grid array package according to claim 1, wherein said thermally conductive die adapter comprises a plurality of thermally conductive die adapter portions stacked on said semiconductor die.

3. The cavity-down ball grid array package according to claim 2, wherein one portion of said die adapter is a solid ground.

4. The cavity-down ball grid array package according to claim 2, wherein one portion of said die adapter is a solid power.

5. The cavity-down ball grid array package according to claim 1, further comprising wire bonds connecting said semiconductor die to said die adapter.

6. The cavity-down ball grid array package according to claim 1, further comprising wire bonds connecting said semiconductor die to said heat spreader.

7. The cavity-down ball grid array package according to claim 1, further comprising wire bonds connecting said heat spreader to said die adapter.

8. The cavity-down ball grid array package according to claim 1, further comprising wire bonds connecting said flexible circuit tape to said die adapter.

9. The cavity-down ball grid array package according to claim 1, wherein said die adapter protrudes from said encapsulating material such that at least a surface of said die adapter is exposed.

* * * * *